(12) United States Patent  
Lott et al.

(10) Patent No.: US 6,706,466 B1
(45) Date of Patent: Mar. 16, 2004

(54) ARTICLES HAVING IMAGABLE COATINGS

(75) Inventors: Martyn Lott, Leeds (GB); Colin Shoesmith, Leeds (GB); John David Riches, Wakefield (GB); Gareth Rhodri Parsons, Leeds (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 49 days.

(21) Appl. No.: 09/587,813

(22) Filed: Jun. 6, 2000

Related U.S. Application Data

(60) Provisional application No. 60/146,920, filed on Aug. 3, 1999.

(51) Int. Cl.$^7$ .............. G03F 7/038; G03F 7/20; G03F 7/26; G03F 7/30
(52) U.S. Cl. .............. 430/327; 430/330; 430/302; 430/326; 430/311; 430/271.1; 430/909; 430/944
(58) Field of Search .................. 430/327, 909, 430/944, 311, 330, 326, 302, 271.1

(56) References Cited

U.S. PATENT DOCUMENTS

| | | | |
|---|---|---|---|
| 4,708,925 A | 11/1987 | Newman | 430/270 |
| 5,085,972 A | 2/1992 | Vogel | 430/270 |
| 5,286,612 A | 2/1994 | Telfer | 430/335 |
| 5,340,699 A | 8/1994 | Haley et al. | 430/302 |
| 5,372,907 A | 12/1994 | Haley et al. | 430/157 |
| 5,372,915 A | 12/1994 | Haley et al. | 430/302 |
| 5,441,850 A | 8/1995 | Marshall et al. | 430/336 |
| 5,466,557 A | 11/1995 | Haley et al. | 430/278 |
| 5,491,046 A | 2/1996 | DeBoer et al. | 430/302 |
| 5,510,420 A * | 4/1996 | Dammel et al. | 525/134 |
| 5,667,942 A * | 9/1997 | Nakao et al. | 430/327 |
| 6,002,108 A * | 12/1999 | Yoshioka | 219/388 |
| 6,143,471 A * | 11/2000 | Takata et al. | 430/281.1 |
| 6,391,524 B2 * | 5/2002 | Yates et al. | 430/286.1 |

FOREIGN PATENT DOCUMENTS

| | | |
|---|---|---|
| EP | 0652483 | 5/1995 |
| EP | 0672954 | 9/1995 |
| EP | 0819980 | 1/1998 |
| GB | 1245924 | 9/1971 |
| JP | 08008170 | 1/1996 |
| WO | 9620429 | 7/1996 |
| WO | 9739894 | 10/1997 |
| WO | 9901795 | 1/1999 |
| WO | 9901796 | 1/1999 |
| WO | 9908879 | 2/1999 |
| WO | 9921715 | 5/1999 |
| WO | 9921725 | 5/1999 |
| WO | WO 00/29214 | 5/2000 |

* cited by examiner

*Primary Examiner*—Janet Baxter
*Assistant Examiner*—Sin J. Lee
(74) *Attorney, Agent, or Firm*—Faegre & Benson LLP

(57) ABSTRACT

Imageable articles comprising positive working polymeric coatings on substrates are given a heat treatment as part of their manufacture, notably at a moderate temperature for an extended period. This heat treatment improves the development characteristics of the coatings in use. It has been found that by carrying out the heat treatment on articles wrapped in a water-impermeable material or in a humidity-enhanced oven, development characteristics may be further improved, especially adjacent to the edges of articles. The imageable articles include precursors for lithographic printing plates and for printed circuits.

44 Claims, No Drawings

ARTICLES HAVING IMAGABLE COATINGS

CROSS-REFERENCE TO RELATED APPLICATION

This application claims the benefit of U.S. Provisional Application No. 60/146,920, filed Aug. 3, 1999, which is incorporated herein by reference.

BACKGROUND OF THE INVENTION

1. Field of the Invention

This invention relates to methods of providing precursors for use in image-forming methods, for example to make lithographic printing forms or electronic parts, such as printed circuits. The invention relates further to such precursors per se, and to their use. More particularly, a precursor of this invention is prepared by providing an imageable coating comprising a polymeric composition, and the precursor is heat treated in such a manner as to inhibit removal of moisture from the precursor during the heat treatment.

2. Background Information

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water while the image area accepts ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

New types of "waterless" lithographic printing employ only an oily ink material and preferentially ink-accepting image areas and ink-repelling non-image areas on the printing form. A generally used type of lithographic printing form precursor (by which is meant a coated printing form- or plate-prior to exposure and development) has a radiation sensitive coating applied to an aluminum substrate. Negative working lithographic printing form precursors have a radiation sensitive coating which, when imagewise exposed to radiation of a suitable wavelength, hardens in the exposed areas. On development the non-exposed areas of the coated composition are removed leaving the image. On the other hand, positive working lithographic printing form precursors have a radiation sensitive coating, which after imagewise exposure to radiation of a suitable wavelength becomes more soluble in the exposed areas than in the non-exposed areas, in a developer. In both cases only the image area on the printing form itself is ink-receptive.

The differentiation between image and non-image areas is made in the exposure process where a film is applied to the printing form precursor with a vacuum to ensure good contact. The printing form precursor is then exposed to a radiation source; conventionally this has been a UV radiation source. In the case where a positive printing form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed on development.

The resists used in pattern forming methods for electronic parts such as printed circuits are also classified into two types: negative working and positive working. After exposure to radiation and development, the resist pattern is used as a mask for forming the patterns onto the underlying electronic elements—for example, by etching an underlying copper foil. Due to the high resolution demands and the requirements of high resistance to etching techniques, positive-working systems are widely used. In particular, in the main there have been used alkali developable positive working resists mainly composed of alkali-soluble novolak resins.

The types of electronic parts whose manufacture may use a resist include printed wiring boards (PWBs), thick- and thin-film circuits, comprising passive elements such as resistors, capacitors and inductors; multichip devices (MDCs); and integrated circuits (ICs). These are all classified as printed circuits.

Imagable compositions may also be applied to masks. The required pattern is formed on the mask, which is then used as a screen in a later processing step, in forming a pattern on, for example, a printing or electronic part precursor.

Common to virtually all commercial applications of positive working systems employing UV radiation over several decades have been compositions comprising alkali soluble phenolic resins and naphthoquinone diazide (NQD) derivatives. The NQD derivatives have been simple NQD compounds used in admixture with resins, or NQD resin esters in which the photoactive NQD moiety has been chemically attached to the resin itself, for example by esterification of the resin with an NQD sulphonyl chloride.

As demands on the performance of UV sensitive positive working coatings have increased so NQD technology has become limiting. In addition, digital and laser imaging technology is making new demands on the coatings.

It is known from G.B. 1245924 that the solubility of phenolic resins in developers may be increased by the application of beat. The heat may be delivered by infra-red radiation, assisted by radiation absorbing components such as carbon black or Milori Blue (C.I. Pigment Blue 27). However the developer resistance of the non-exposed areas to commercial developers is low, and the solubility differential generated on application of heat is low compared to the commercial UV sensitive compositions containing NQD moieties.

U.S. Pat. No. 5,372,915 is an example of a printing form containing a radiation sensitive composition which is comprised of a resole resin, a novolak resin, a latent Brönsted acid and an infrared absorber. In the preparation of a lithographic printing form, the radiation sensitive composition is imagewise exposed to activating infrared radiation and the exposed areas of the printing form are removed with an aqueous alkaline developing solution. Related U.S. Pat. No. 5,340,699 discloses the preparation of a lithographic printing form using the same radiation sensitive composition as in U.S. Pat. No. 5,372,915. But in this related patent the radiation sensitive composition is imagewise exposed to activating radiation, and the printing form is then heated to provide reduced solubility in exposed areas and increased solubility in unexposed areas. The unexposed areas of the printing form are then removed with an aqueous alkaline developer. Although the composition is the same, a positive or a negative lithographic image is produced in accordance with each respective patent by varying the activating radiation and adding a blanket heating step.

Further examples of radiation sensitive compositions and their use in making lithographic printing forms are disclosed in U.S. Pat. Nos. 4,708,925; 5,085,972; 5,286,612; 5,441,850; 5,491,046; 5,340,699; 5,466,557; 5,372,907; European Patent Application No. 672 954 A2; and WIPO Publication WO 96/20429.

Additional positive working heat sensitive systems have been developed to meet the new demands, such as are disclosed in WIPO Publications WO 97/39894, WO 99/01796, WO 99/01795 and WO 99/08879.

It has been observed that, in many positive working systems, there may be an alteration in sensitivity over time, after the heat sensitive composition has been applied to a substrate and dried, such effect being the result of reduced developer solubility of the unexposed compositions with time prior to exposure. Thus, as used in this application "sensitivity" is referred to in the context of the entire process of exposure and development, i.e. not referring only to the matter of to how the areas of the composition which are exposed react to that exposure. Sometimes this "sensitivity" is called "operating speed" in the lithographic printing art. A method which improves positive working systems, such that a more consistent and stable product can be supplied to an end user has previously been disclosed in WIPO Publication WO 99/21715. In accordance with a preferred method described in WO 99/21715, a positive working precursor is given a heat treatment at a moderate temperature, for example 40–90° C., for an extended period, for example at least 4 hours. In the method described a precursor, or a stack of precursors separated by interleaving paper, is wrapped in lightproof paper (unbleached, unglazed Kraft 90 gm−2, coated with matt black low density polythene 20 gm−2 as supplied by Samuel Grant, Leeds, UK).

The method of WO 99/21715 is an effective one but the properties of the coating are not always fully optimised adjacent to the extremities of the stack, so that precursors at the top and bottom of the stack, and edge regions of other precursors, may be imperfect.

It is an object of the invention to provide an improved method which can produce precursors which are optimised over a greater area than can often by achieved using the prior method. It is another object of this invention to provide precursors which are of consistent performance over all of their area.

SUMMARY OF THE INVENTION

The method of this invention offers improvement in the production of precursors, such that the products are consistent and stable or show good resistance to undesired developer attack in regions which have not been imaged, across a large area or both; often over their entire coated surface. The invention may also be applied to other positive working compositions, for example those described above.

In accordance with a first embodiment of the invention there is provided a method of providing a precursor which comprises an imageable coating on a substrate, the coating comprising a polymeric composition, wherein the method includes a heat treatment step applied to the precursor, the heat treatment step taking place under conditions which inhibit the removal of moisture from the precursor during the heat treatment Preferably the polymeric composition is positive working.

One method of inhibiting the removal of moisture from a precursor during the heat treatment is to wrap or encase the precursor in a water-impermeable sheet material, for example of plastic, metal or waterproof paper. Water-impermeable sheet materials which are sufficiently flexible to conform to any irregularities of the substrate, for example plastics films and metallic foils, are preferred impermeable sheet materials.

Another method of inhibiting removal of moisture from a precursor during the heat treatment is to carry out the heat treatment in a non-drying environment, for example an oven having humidity control means set to an appropriate, predetermined, level of humidity.

Without wishing to be bound by any one theory, it is believed that the mechanism of the invention involves the maintenance of water content of the precursor. The objective steps we have found to be effective in realizing the object of the invention are the use of a water-imperneable sheet material or the use of an oven with a reasonable level of humidity, and the invention may be defined in further embodiments in such objective terms without reference to the theorized mechanism.

Thus, in accordance with a second embodiment of the invention there is provided a method of providing a precursor which comprises an imageable coating on a substrate, the coating comprising a positive working polymeric composition, wherein the method includes a heat treatment step applied to the precursor, the heat treatment step being carried out with the precursor wrapped or encased in substantially water-impermeable material.

Further, in accordance with a third embodiment of the present invention there is provided a method of providing a precursor which comprises an imageable coating on a substrate, the coating comprising a positive working polymeric composition, wherein the method includes a heat treatment step applied to the precursor, the heat treatment step being carried out in an oven which provides an atmosphere of relative humidity which is at least 25%.

In accordance with a fourth embodiment of the present invention there is provided a method of providing a precursor which comprises an imageable coating on a substrate, the coating comprising a positive working polymeric composition, wherein the method includes a heat treatment step applied to the precursor, the heat treatment step being carried out in an oven which provides an environment of absolute humidity at least 0.028.

DETAILED DESCRIPTION OF THE INVENTION

Preferably the method of providing a precursor includes the application of the composition in a solvent to the substrate, the drying of the composition, and the subsequent heat treatment of the resultant precursor, in accordance with the invention.

Preferably the heat treatment employs an elevated temperature, for an extended period; but the range of effective conditions, and the optimal conditions to achieve a substantially constant sensitivity over time, and at a practicable level, will vary from case to case, and can be determined by using well known techniques such as trial and error, as will be well understood by those skilled in the art. Without wishing to be bound by any one theory it is believed that a suitable heat treatment accelerates the formation of a stable network structure within the composition. If the elevated temperature is too low the time required for this stable network structure to form is too long to be practicable. Furthermore in relation to the minimum suitable temperature, the elevated temperature should desirably not be less than that which the precursor might typically be subjected to in transit or in storage, otherwise changes in sensitivity may occur. Consequently, it is preferred to carry out the heat treatment at a temperature of at least 40° C., preferably at least 45° C., most preferably at least 50° C. As regards the upper limit, it is believed that at too high a temperature the time for which the heat treatment should be carried out to obtain a desired level and stability of sensitivity is likely to be overly critical, and that even when the sensitivity is adequately stable, it is likely to be too low to be of use. Again, well known techniques can easily be used to make this determination, but it is preferred to use a temperature not in excess of 90° C., preferably not in excess of 85° C., most preferably not in excess of 60° C. In general, heat treatments in which the maximum temperature does not exceed the glass transition temperature (Tg) of the composition (as measured by differential scanning calorimetry (DSC) at a heating rate of 10° C./minute) are preferred as such heat treatments may be carried out on a stack of precursors or on a precursor coil, and so are efficient.

Temperatures in the range 50–70° C. (inclusive) are particularly preferred in the method of the present invention, at least when the compositions comprise phenolic resins, such as novolaks.

The time for the heat treatment can also be determined by trial and error. Generally, the lower the temperature for the heat treatment, the longer the time should be. In all cases however we favor carrying out the heat treatment for at least 4 hours, preferably for at least 12 hours, more preferably for at least 24 hours and most preferably for at least 48 hours.

The time and temperature conditions for the heat treatment may be contrasted with the time and temperature conditions for the drying step, when employed. The beat treatment step preferably employs a lower temperature and a longer time, than the drying step. In the drying step the aim is to "flash dry" the composition, The time may typically be 15–600 seconds, preferably 25–250 seconds and the temperature may typically be at least 70° C., say 80–50° C., preferably 90–140° C. The drying step should be carried out until the coating is self-supporting and dry to the touch.

The solvent itself is not critical; any solvent in which at least the polymeric content of the composition can be dissolved and which may be removed by evaporation after coating may be used.

It has been found that by carrying out a heat treatment step as described above the sensitivity of the coating maybe rendered less variable over time. Further, it has been found that the coating may be rendered more resistant to undesired attack by a developer in non-imaged regions. Without wishing to be bound by any one theory, it is believed that the beat treatment step aids the formation of a stable network structure within the coating, and that this is a key factor in achieving both benefits mentioned above. The measures of the present invention assist in obtaining these benefits across a larger proportion of the coating than has heretofore proved possible.

When the heat treatment takes place with the precursor wrapped or encased in an impermeable sheet material, it is preferably sufficiently flexible to conform closely to the shape of the precursor. Preferably the material is in close contact with the precursor. Preferably the material is sufficiently tight or is sealed, or both, so as to represent an effective barrier to moisture removal from the precursor. Preferred materials are plastics films and metallic foils but waterproof papers may be used, suitably with their overlapped edges sealed with tape. Preferably however, a paper material is not used due to its comparative inability to conform to the precise shape of the precursor, compared with plastic films and metal foils.

When the heat treatment takes place with the precursor in an oven with humidity control means the latter is suitably set such that the relative humidity in the oven is at least 30%, more preferably at least 35%, most preferably at least 40%.

Alternatively or additionally a heat treatment employing humidity control suitably employs an atmosphere of absolute humidity at least 0.028, preferably at least 0.033, more preferably at least 0.04, and most preferably at least 0.048.

Relative humidity as defined herein is the amount of water vapour present in air expressed as a percentage of the amount required for saturation at the same temperature. Absolute humidity as defined herein is the ratio between the mass of water vapour to the mass of air in a water-vapour air mixture.

Preferably a stack of precursors is subjected to the heat treatment at the same time. The stack suitably comprises at least 100, and commonly at least 500 precursors which require the heat treatment.

It may be difficult to achieve good wrapping at the top and bottom of such a stack using an impermeable material and so in such embodiments it may be desirable to use dummy materials in those regions; for example an additional sub-stack of reject or dummy precursors or a block of any convenient material. When reject precursors are used the stack suitably comprises at least 100 useful precursors, plus any reject or dummy precursors.

Alternatively a precursor coil may, with some coatings, be heat treated and cut into individual precursors later. Typically such a coil has at least 1000 $m^2$ of imageable surface, and commonly at least 3000 $m^2$.

Adjacent "spirals" of a coil or "strata" of a stack may, if wished, be separated by interleaving material, for example paper or tissue. The paper or tissue may advantageously be sized or coated with a plastics material, for example polythene.

It will be appreciated that a primary object of the invention is to render the sensitivity (as previously defined) of the coating less variable over time over a large area, or the whole of, a precursor. This is suitably assessed over a period of time which is the longest interval likely, between the manufacture of the precursor, and the use of the precursor by a customer. It is expected that one year is a suitable period of time for this assessment In absolute terms, preferably the heat treatment is such that the sensitivity reduction in a given developer over a one-year period after the heat treatment does not exceed 15%; and preferably does not exceed 10%. The invention has the further, and allied, benefit, obtained immediately after the heat treatment has been carried out, that the coating is rendered more developer resistant prior to imaging and, after imaging, in non-imaged areas. This leads to a way of assessing the effectiveness of the heat treatment immediately thereafter: desirably it causes a substantial increase in the time required to dissolve the non-imaged coating in a developer. By "substantial increase" as used herein, it is meant that the increase is at least 50% longer, preferably at least 100% longer, more preferably at least 200% longer. In practice, increases of 300% or or more can be achieved by methods of the invention, compared with corresponding compositions which have not undergone a suitable heat treatment. The reference developer for those preferred embodiments requiring an aqueous developer is a 14 wt % solution of sodium metasilicate in water, and that the reference temperature is 20° C. That is not to say that such a developer and temperature must be used in practical imaging and development methods applied by customers. It is believed this test, which looks at a property which is itself of importance, is also a useful inferential test as regards stability over time; in other words, that precursors which perform well in this test are likely to perform well over time.

The present invention is very successful if the parameters defined above are found across substantially the whole imageable surface of the precursor.

Thus, preferably the beat treatment is such that the developer solubility of the non-imaged coating is at or near (suitably within 10% of) the minimum which can be achieved by the method, for that coating, across substantially the whole of the imageable surface of the heat treated precursor. Without wishing to be bound by any one theory, it is believed that there is a minimum solubility of the non-imaged coating, which the method can achieve for a given composition.

A further object of the present invention is that the sensitivity of the preferred coatings should be at a practicable level, after the heat treatment; suitably no more than 600 mJcm$^{-2}$, preferably no more than 400 mJcm$^{-2}$, most preferably no more than 250 mjcm$^{-2}$, and especially no more than 200 mJcm$^{-2}$.

Preferred compositions are those which after imaging are soluble in aqueous developers.

Many polymeric compositions show changes in their performance over time, and may be improved by the heat treatment step of the invention. Examples of polymers which may be present in the composition include phenolic resins, poly(hydroxystyrenes) and polyacrylic resins, as homopolymers, copolymers or terpolymers. Preferably the polymeric composition includes a polymer having hydroxyl groups. Preferably the composition contains at least 20%, more preferably at least 50%, most preferably at least 70%, of such a resin, or of such resins in total, by weight on total weight of the composition.

Particularly useful phenolic resins in this invention are condensation reaction products between appropriate phenols, for example phenol itself, C-alkyl substituted phenols (including cresols, xylenols, p-tert-butyl-phenol p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. Dependent on the preparation route for the condensation a range of phenolic materials with varying structures and properties may be formed. Particularly useful in this invention are novolak resins, resole resins and novolak/resole resin mixtures. Most preferred are novolak resins. The type of catalyst and the molar ratio of the reactants used in the preparation of phenolic resins is well known to those skilled in the art, and determines the molecular structure and therefore the physical properties of the resin. An aldehyde: phenol ratio between 0.5:1 and 1:1, preferably 0.5:1 to 0.8:1 and an acid catalyst is used to prepare novolak resins.

Examples of suitable novolak resins have the following general structure

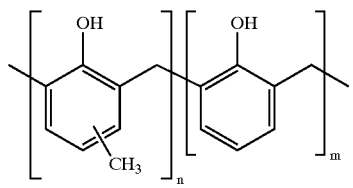

where the ratio of n:m is in the range of 1:20 to 20:1, say 3:1 to 1:3. In one preferred embodiment n=m. However, in certain embodiments n or m may be zero. Novolak resins suitable for use have a molecular weight in the range of about 500–20,000, preferably in the range of about 1000–15,000, say about 2500–10,000.

Other polymers suitable for inclusion in the composition, notably in admixture with a phenolic, preferably novolak, resin, include: poly-4-hydroxystyrene; copolymers of 4-hydroxystyrene, for example with 3-methyl-4-hydroxystyrene or 4methoxystyrene; copolymers of (meth) acrylic acid, for example with styrene; copolymers of maleimide, for example with styrene; hydroxy or carboxy functionalised celluloses; dialkylmaleiimide esters; copolymers of maleic anhydride, for example with styrene; and partially hydrolysed polymers of maleic anhydride.

The composition is preferably such that it is patternwise solubilized by heat, during the pattern forming (exposure) process. In broad terms there are three ways in which heat may be patternwise delivered to the composition, in use. These are:

(1) Direct heat, i.e. the direct delivery of heat by a heated body, by conduction. For example the composition may be contacted by a heat stylus; or the reverse face of the substrate onto which the composition has been coated may be contacted by a heated body. A heated body may be a heat stylus.

(2) The use of incident electromagnetic radiation to expose the composition, the electromagnetic radiation being converted to heat, either directly or by a chemical reaction undergone by a component of the composition. The electromagnetic radiation could for example be infra-red, or UV or visible radiation, depending on the composition. Preferably it is infra-red.

(3) The use of charged-particle radiation, for example electron beam radiation. Clearly, at the fundamental level the charged-particle mode and the electromagnetic mode are convergent; but the distinction will be clear to those skilled in the art at the practical level.

The time and temperature conditions for the heat treatment of the invention, carried out as part of the method of manufacturing a precursor, or of refreshing or restoring a precursor, may also be contrasted with the delivery of heat during the later exposure process, for those preferred coatings which are heat sensitive, the latter delivery of heat being of very short duration and very high intensity.

In patternwise exposing the precursor the use of electromagnetic radiation is preferred. To increase the sensitivity of the preferred beat sensitive coatings used in the present invention it is beneficial in embodiments intended for exposure using electromagnetic radiation to include an additional component, namely a radiation absorbing compound capable of absorbing the incident electromagnetic radiation and converting it to heat (hereinafter referred to as a "radiation absorbing compound"). It may also be desirable to include a suitable radiation-absorbing compound in embodiments intended for exposure using charged particle radiation.

In preferred compositions intended to require electromagnetic radiation for exposure, the coating may be such that it can be exposed by means of a laser under digital control. Preferably, such a laser emits radiation at above 450 nm, preferably above 500 nm, more preferably above 600 nm, and especially above 700 nm. Most preferably it emits radiation at above 800 nm. Suitably it emits radiation of wavelength below 1400 nm, preferably below 1300 nm, more preferably below 1200 nm.

Examples of lasers which can be used to expose coatings suitable for the method of the present invention include semiconductor diode lasers emitting at between 450 nm and 1400 nm, especially between 600 nm and 1200 nm. One example is the Nd YAG laser which emits at 1064 nm and another is the diode laser used in the Creo TRENDSETTER thermal image setter, which emits at 830 nm, but any laser of sufficient imaging power and whose radiation is absorbed by the coating to produce heat, may be used.

Preferably the radiation absorbing compound is one whose absorption spectrum is such that absorption is significant at the wavelength output of the radiation source, preferably laser, which is to be used in the patternwise exposure of precursors made by the method of this invention. Usefully it may be an organic pigment or dye. It may be a black body radiation absorber, such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich. It may be a dye or pigment of the squarylium, merocyanine, phthalocyanine, cyanine, indolizine, pyrylium or metal dithioline classes.

In preferred coatings intended to require infra-red radiation for patternwise exposure it is preferred that their developer solubility is not increased by incident UV or visible radiation, thus making handling of the compositions straightforward. Preferably such coatings do not comprise any UV or visible light sensitive components. However U or visible light sensitive components which are not activated by UV or visible light due to the presence of other components, such as UV or visible light absorbing dyes or a UV or visible light absorbing topmost layer, may be present in such coatings.

Pigments are generally insoluble in the coatings and so comprise particles therein. Generally they are broad band absorbers, which are preferably able efficiently to absorb electromagnetic radiation and convert it to heat over a range of wavelengths exceeding 200 nm in width, preferably exceeding 400 nm in width. Generally they are not decomposed by the radiation. Generally they have no or insignificant effect on the solubility of the unheated coating in the developer. In contrast dyes are generally soluble in the coatings. Generally they are narrow band absorbers, typically able efficiently to absorb electromagnetic radiation and convert it to heat only over a range of wavelengths typically not exceeding 100 nm in width, and so must be selected in view of the wavelength of the radiation which is to be used for imaging.

Suitably the radiation absorbing compound, when present, constitutes at least 0.25%, preferably at least 0.5%, more preferably at least 1%, most preferably at least 2%, preferably up to 25%, more preferably up to 20%, most preferably up to 15%, of the total weight of the coating. A preferred weight range for the radiation absorbing compound may be expressed as 0.25–25% of the total weight of the coating. More specifically, in the case of dyes the range may preferably be 0.25–15% of the total weight of the coating, preferably 0.5–8%, while in the case of pigments the range may preferably be 1–25%, preferably 2–15%. For pigments, 5–15% may be especially suitable. In each case the figures given are as a percentage of the total weight of the dried coating. There may be more than one radiation-absorbing compound. References herein to the proportion of such compound or compounds are to the total content of such compound or compounds.

A preferred, heat sensitive, coating preferably includes a modifying means for modifying the properties of the coating. Such a modifying means is preferably arranged to alter the developer solubility of the coating compared to when the modifying means is not present in the coating. The modifying means may be covalently bonded to a polymer of the coating or may be a compound which is not covalently bonded thereto.

The modifying means may be selected from:
(1) Functional groups as described in WO 99/01795 (incorporated herein by reference).
(2) Diazide moieties described in WO 99/01796 (incorporated herein by reference).
(3) Separate reversible insolubilizer compounds, not being diazide moieties, and described in WO 97/39894, WO 99/08879 and WO 99/21725 (all incorporated herein by reference). Examples described include nitrogen-containiing compounds wherein at least one nitrogen atom is either quaternized or incorporated in a heterocyclic ring; or quaternized and incorporated in a heterocyclic ring. Examples of useful quarternized nitrogen containing compounds are triaryl methane dyes such as Crystal Violet (Cl basic violet 3) and Ethyl Violet. WO 97/39894 describes lithographic printing applications and WO 99/08879 describes electronic part applications of this technology. WO 99/21725 describes improvements to this technology brought about by the use of certain developer resistance aids, notably siloxane compounds.
(4) Latent Bronsted acids, onium salts or acid generating compounds as described in patents mentioned above, for example U.S. Pat. Nos. 5,491,046 and 4,708,925, and EP 819980 (all incorporated herein by reference).

The preferred embodiments of the present invention involve the heat treatment of coatings which do not contain diazide moieties.

It is believed that the present invention may be applied with benefit to precursors with a wide range of imageable coatings; but particularly to such coatings for which pattern wise exposure entails the delivery of heat to selected areas of the precursor, and especially to such coatings for which delivery of heat causes the solubility change not by irreversible chemical decomposition. In preferred compositions to which the present invention is applied heat imaging produces areas which have transient increased solubility in the developer. After an interval such areas may partially or wholly revert to their original, non-imaged level of solubility. Thus the mode of action of such preferred coatings does not require heat-induced lysis of the modifying means but, more likely, the break-up of a physicochemical complex, which can re-form. Consequently, in such preferred embodiments the precursor is contacted with a developer within a time period of 20 hours or less of the exposure to imaging heat, preferably within about 120 minutes of exposure, and most preferably within 5 minutes of exposure.

A preferred coating to which the method of the present invention may advantageously be applied contains a reversible insolubilizer compound and, preferably, an infra-red absorbing compound; or a compound which functions as a reversible insolubilizer compound and as an infra-red absorbing compound. Examples are given in WO 97/39894, WO 99/08879 and WO 99/21725. Indeed, the coatings and precursors described in WO 97/39894, WO 99108879 and WO 99/21725 are preferred coatings and precursors to which the present invention may be applied.

Suitably a reversible insolubilizer compound, when present (whether or not also acting as a radiation absorbing compound) constitutes at least 0.25%, preferably at least 0.5%, more preferably at least 1%, and most preferably at least 2%; and preferably up to 15%, more preferably up to 25%, of the total weight of the coating.

An especially preferred coating to which the present invention may be applied thus comprises a coating as defined above, and, additionally, either an infra-red absorbing compound to convert infra-red radiation to heat and a said reversible insolubilizer compound as described in WO 97/39894 and WO 99/08879; or an infra-red absorbing compound which converts infra-red radiation to heat and which also functions as a reversible insolubilizer compounds Suitably it additionally contains a developer resistance means as defined in WO 99/21725, suitably a siloxane, preferably constituting 1–10 wt % of the composition. Preferred siloxanes are substituted by one or more optionally-substituted alkyl or phenyl groups, and most preferably are phenylalkylsiloxanes and dialkylsiloxanes. Preferred siloxanes have between 10 and 100 repeat units of —Si($R_1$)($R_2$)O—. The siloxanes may be copolymerised with ethylene oxide or propylene oxide, or both. Other preferred siloxanes are described in WO 99/21725.

The coatings used in the invention may contain other ingredients such as stabilising additives, inert colorants, and additional inert polymeric binders as are present in many positive working coatings.

In certain embodiments of the invention an additional layer comprising a radiation-absorbing compound may be used. This multiple layer construction may provide routes to high sensitivity as larger quantities of absorber can be used without affecting the function of the image-forming layer. In principle any radiation absorbing material which absorbs sufficiently strongly in the desired band can be incorporated or fabricated in a uniform coating. Dyes, metals and pigments (including metal oxides) may be used in the form of vapour deposited layers. Techniques for the formation and use of such films are well known in the art for example as described in EP-A652483, incorporated herein by reference.

The precursor includes a substrate over which said coating is provided. The substrate may comprise a metal layer. Preferred metals include aluminum, zinc, copper and titanium.

In embodiments of the invention intended as printing form precursors, the substrate may be arranged to be non-ink-accepting. The substrate may have a hydrophilic surface for use in conventional lithographic printing using a fount solution or it may have an ink-repelling surface suitable for use in waterless printing.

The substrate may be any type of substrate usable in printing. For example, it may comprise a cylinder or, preferably, a plate.

For printing applications the substrate may be aluminum which has undergone the usual anodic, graining and post-anodic treatments well known in the lithographic art for enabling a radiation sensitive composition to be coated thereon and for its surface to function as a printing background. Another substrate which may be used in the present invention in the context of lithography is a plastics material base or a treated paper base as used in the photographic industry. A particularly useful plastics material base is polyethylene terephthlate which has been subbed to render its surface hydrophilic. Also a so-called coated paper which has been corona discharge treated may be used.

Preferred printing forms have a substrate which has a hydrophilic surface and an oleophilic ink-accepting coating.

For electronic part applications the substrate may comprise a copper sheet, for example a copper/plastics laminate. After imaging and development an etching agent may be used to remove exposed metal regions, leaving, for example, a printed circuit.

For mask applications the substrate may be a plastics film.

As used herein, reference to a coating as "developer soluble" means that the coating is soluble in a selected developer, to an extent useful in a practical development process. Similarly, as used herein reference to a coating as "developer insoluble" means that the coating is not soluble in the selected developer, to an extent useful in a practical development process.

Thus in preferred embodiments a positive working pattern may be obtained after patternwise exposure and development of a precursor made by the method of the present invention. The developer solubility of the coating after it has been subjected to heat during patternwise exposure is greater than the solubility of the corresponding unexposed coating. In preferred embodiments this solubility differential is increased by means of additional components or by resin modification, or both, as described herein, and in earlier patents and patent applications as described above. Preferably such measures reduce the solubility of the polymeric composition, prior to the patternwise exposure. On subsequent patternwise exposure the exposed areas of the coating are rendered more soluble in the developer than the unexposed areas. Therefore on patternwise exposure there is a change in the solubility differential of the unexposed coating and of the exposed coating. Thus in the exposed areas the coating is dissolved, to form the pattern.

The coated precursor produced by the method of the invention may in use be patternwise heated indirectly by exposure to a short duration of high intensity radiation transmitted or reflected from the background areas of a graphic original located in contact with the recording material.

The developer is dependent on the nature of the coating, but is preferably an aqueous developer. Common components of aqueous developers are surfactants, chelating agents such as salts of ethylenediamine tetraacetic acid, organic solvents such as benzyl alcohol, and alkaline components such as inorganic metasilicates, organic metasilicates, hydroxides or bicarbonates.

Preferably an aqueous developer is an alkaline developer containing one or more inorganic or organic metasilicates.

In accordance with a fifth embodiment of this present invention there is provided a precursor provided by a method as previously defined. The precursor may be a precursor for an electronic part, a mask, or, especially, a printing form.

In accordance with a sixth embodiment of this invention there is provided a method of producing an article bearing a pattern in a coating thereon, from a precursor as described above with respect to the fourth embodiment of this invention, comprising an exposure step to render selected areas of the coating developer soluble, followed by development in a developer to remove said selected areas. The exposure step preferably entails heating the selected areas. The heating of selected areas may be effected as described above.

In accordance with a seventh embodiment of this invention there is provided an article bearing a pattern in a coating thereon, produced by the method of the sixth embodiment of this invention, as described above.

The following examples more particularly serve to illustrate the present invention described hereinabove.

EXAMPLES

In the following examples the substrate was a 0.3 mm thickness aluminum sheet electrograined and anodised and post-anodically treated with an aqueous solution of an inorganic phosphate. The coating solution contained the following components:

14 wt % LB6564—a phenol/cresol novolak resin marketed by Bakelite, UK, and believed to have the structure:

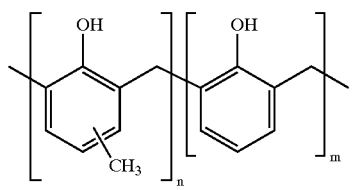

where n=m.

4 wt % LB 744—a cresol novolak resin marketed by Bakelite, UK. 0.4 wt % KF654B PINA as supplied by Riedel de Haan UK, Middlesex, UK, and believed to have the structure:

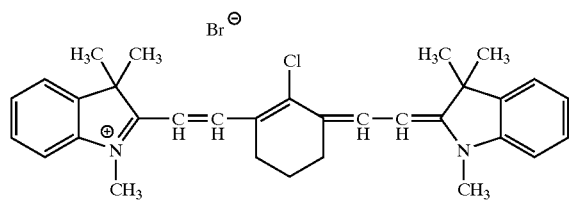

0.4 wt % crystal violet (basic violet 3, C.I. 42555, Gentian Violet) as supplied by Aldrich Chemical Company of Dorset, UK, and believed to have the structure:

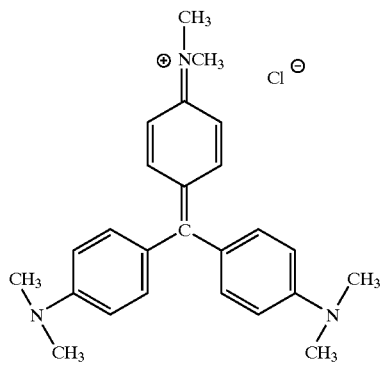

1.2 wt % Silikophen P50X: a phenyl methyl siloxane as supplied by Tego Chernie Service GmbH of Essen, Germany.

80 wt % 1-methoxypropan-2-ol/xylene (98:2 v:v)

Example 1

The coating solution was reverse roller coated onto the substrate. The solution concentration had been selected to provide the dry coating with a coating weight of 2 gm$^{-2}$. After thorough drying at 110° C. for 30 seconds in a hot air displacement oven the substrate was wound up as a coil. The coil was cut to four individual precursors of size about 115 cm×92 cm, which were laid horizontally in stacks on pallets, typically with about 1500 precursors in a stack, and with an interleaving sheet between adjacent precursors. The interleaving sheets were a polythene coated paper No 22, 6 gm$^{-2}$, available from Samuel Grant, Leeds, UK. At both the top of the stack, 5 dummy precursors were placed. Four such stacks were made. Three of them were wrapped in polythene in accordance with the invention. The polythene was cast clear polythene film sold under the trade name POLYFLEX by Samuel Grant, having a thickness of 23 μm, film density of 0.918, and width of 50 cm. To effect the wrapping a stack was placed on a turntable adjacent to a polythene film feeder, from which the polythene film could be drawn. The turntable was rotated 11 times to provide 11 tight wraps of polythene, while a feeder traversed up and down. The edges of each plate were very well covered by the polythene, which conformed closely to irregularities of the vertical sides of the stack. The top and bottom surfaces of the stack were not covered over by the polythene, but at the top the free edges of the polythene were taped to the top surface of the upper dummy plate. The four stacks, three wrapped and one unwrapped, were then placed in an oven for 72 hours at 55° C. The oven was a 2.3 m×2.3 m×2.3 m oven recirculating warm air supplied by two fans via plenums on two sides of the oven. The recirculating volume was 5500 cubic feet per minute (2.6 m³/second). At the end of this period the stacks were removed from the oven and put in ambient air to cool entirely to ambient temperature, and the wrapping was then removed. Precursors from within the stacks were tested across their entire surface by imaging them using infra-red radiation. The imaging took place on a Creo TRENDSETTER, available from Creo Products, Burnaby, Canada, using radiation of wavelength 830 nm at a drum speed of 138 rpm, a laser power of 10W and an imaging energy density of 200 mJ/cm$^{-2}$. Development took place in a Kodak Polychrome Graphics Mercury Mark V processor containing a 14 wt % sodium metasilicate developer at 22.5° C. set at a speed of 750 mm/min. Performance was assessed by comparing actual screen (dot) densities with expected densities, using a Gretag D19C densitometer, available from Colour Data Systems Limited, the Wirral, UK. The sensitometric performance of all samples in each test was near identical, and acceptable, in the center of the precursors. However unacceptable performance at the edges was noted in printing forms from the comparative unwrapped stack only, defined below in terms of "edge trim requirements," of a representative precursor from within each stack. "Edge trim" requirements" as used herein denotes the width which had to be removed from an edge to remove a region of unacceptable performance.

| Edge Trim Requirements (in mm) (1 unwrapped, 3 wrapped stacks, all heat treated together) | | | | |
|---|---|---|---|---|
| | Edge 1 | Edge 2 | Edge 3 | Edge 4 |
| Unwrapped | 100 | 55 | 65 | 45 |
| Wrapped 1 | 0 | 0 | 0 | 0 |
| Wrapped 2 | 0 | 0 | 0 | 0 |
| Wrapped 3 | 0 | 0 | 0 | 0 |

In further tests two wrapped stacks were heat treated. The precursors, stacks, wrapping, heat treatment and cooling were all as previously described. Immediately after removal from the oven, the wrapping was stripped from one stack only and both stacks were left to cool at ambient temperature. In both cases the edge trim requirement was zero.

Laboratory scale tests were also carried out on unwrapped and wrapped precursors using humidity control. Heat treatment was effected in a Sanyo GallenKamp environmental chamber with humidity control provision, Model No. HCCO 19.PFI.F supplied by Sanyo Gallenkamp of Leicester, UKL The precursors, heat treatment and cooling were as described above. However a stack was made up as follows: a wrapped section with ten dummy precursors at the top, then ten precursors to be tested, then ten dummy precursors at the bottom; beneath that wrapped section, ten unwrapped precursors to be tested, then (so, at the very bottom of the stack) ten unwrapped dummy precursors. Wrapping did not employ polythene, but an unbleached, unglazed Kraft 90 gm$^{-2}$ paper, coated with matt black low density polythene, 20 gm$^{-2}$, as supplied by Samuel Grant. In these experiments no edge effects on imaging and development were observed in the test precursors heat treated at a relative humidity of 40%, 60% and 80%. For those heat treated at a relative humidity of 20%, edge imperfections were observed in the test precursors. No differences were observed between wrapped and unwrapped precursors which were heat treated at the same humidity.

Example 2

Laboratory tests were also carried out on unwrapped and wrapped precursors using humidity control. The precursors were as described above for Example 1. Heat treatment at 55° C. was effected in a Sanyo Gallenkamp environmental chamber as described above, with humidity control provision. A stack was made as follows: a wrapped section with ten dummy precursors at the top, then ten precursors to be tested, then ten dummy precursors underneath, and beneath that wrapped section, ten unwrapped precursors to be tested, then finally (so, at the very bottom of the stack) ten unwrapped dummy precursors.

Wrapping did not employ polythene, but an unbleached, unglazed Kraft 90 gm$^{-2}$ paper, coated with matt black low density polythene, 20 gm$^{-2}$, as supplied by Samuel Grant. Precursors from within the wrapped and unwrapped testing precursors were tested across their entire surface. Imaging took place on a Creo TRENDSETTER, set up as described above. Development took place in a Kodak Polychrome Graphics Mercury Mark V processor, set up as described above. Performance was assessed by comparing actual screen densities with expected densities, using the Gretag D19C densitometer.

In these experiments no edge effects on imaging and development were observed in the test precursors heat treated at a relative humidity of 30% at 55° C. and 35% at 55° C. However, for those heat treated at a relative humidity of 20% at 55° C. and 25% at 55° C., edge imperfections were observed in the test precursors. No differences were observed between wrapped and unwrapped precursors which were heat treated at the same humidity.

Densitometer Readings Across a Plate:

1. Relative Humidity of 20% at 55° C.

| Expected Dot Readings (%) | Actual Dot Readings (%) | | | | | | |
|---|---|---|---|---|---|---|---|
| 2 | 1 | 2 | 2 | 2 | 2 | 1 | 1 |
| 5 | 4 | 4 | 5 | 5 | 5 | 5 | 4 |
| 10 | 8 | 9 | 10 | 10 | 10 | 9 | 8 |
| 20 | 17 | 18 | 19 | 19 | 19 | 18 | 17 |
| 30 | 27 | 28 | 29 | 29 | 29 | 28 | 27 |
| 40 | 37 | 38 | 39 | 39 | 39 | 38 | 37 |
| 50 | 47 | 48 | 49 | 49 | 49 | 48 | 47 |
| 60 | 57 | 58 | 59 | 59 | 59 | 58 | 58 |
| 70 | 68 | 69 | 70 | 70 | 70 | 69 | 69 |
| 80 | 79 | 79 | 80 | 80 | 80 | 79 | 79 |
| 90 | 89 | 90 | 90 | 91 | 91 | 90 | 90 |
| 95 | 95 | 95 | 95 | 96 | 96 | 95 | 95 |
| | Left Hand Side Plate Edge | | | Middle of Plate | | | Right Hand Side Plate Edge |

2. Relative Humidity of 25% at 55° C.

| Expected Dot Readings (%) | Actual Dot Readings (%) | | | | | | |
|---|---|---|---|---|---|---|---|
| 2 | 1 | 2 | 2 | 2 | 2 | 2 | 2 |
| 5 | 5 | 5 | 5 | 5 | 5 | 5 | 5 |
| 10 | 10 | 10 | 10 | 10 | 10 | 10 | 9 |
| 20 | 19 | 19 | 20 | 19 | 19 | 20 | 19 |
| 30 | 28 | 29 | 29 | 29 | 29 | 29 | 28 |
| 40 | 38 | 38 | 39 | 39 | 39 | 39 | 38 |
| 50 | 48 | 49 | 49 | 49 | 49 | 49 | 48 |
| 60 | 58 | 59 | 59 | 59 | 59 | 59 | 58 |
| 70 | 68 | 69 | 69 | 69 | 69 | 69 | 68 |
| 80 | 79 | 79 | 79 | 79 | 79 | 79 | 79 |
| 90 | 89 | 89 | 90 | 90 | 90 | 90 | 89 |
| 95 | 95 | 95 | 95 | 95 | 95 | 95 | 95 |
| | Left Hand Side Plate Edge | | | Middle of Plate | | | Right Hand Side Plate Edge |

3. Relative Humidity of 30% at 55° C.

| Expected Dot Readings (%) | Actual Dot Readings (%) | | | | | | |
|---|---|---|---|---|---|---|---|
| 2 | 2 | 2 | 2 | 2 | 2 | 2 | 2 |
| 5 | 5 | 5 | 5 | 5 | 5 | 5 | 5 |
| 10 | 10 | 10 | 10 | 10 | 10 | 10 | 10 |
| 20 | 20 | 20 | 20 | 20 | 20 | 20 | 20 |
| 30 | 30 | 30 | 30 | 30 | 30 | 30 | 30 |
| 40 | 40 | 40 | 40 | 40 | 40 | 40 | 40 |
| 50 | 50 | 50 | 50 | 50 | 50 | 50 | 50 |
| 60 | 60 | 60 | 60 | 60 | 60 | 60 | 60 |
| 70 | 70 | 70 | 70 | 70 | 70 | 70 | 70 |
| 80 | 80 | 80 | 80 | 80 | 80 | 80 | 80 |
| 90 | 90 | 90 | 90 | 90 | 90 | 90 | 91 |
| 95 | 95 | 95 | 95 | 95 | 95 | 95 | 95 |
| | Left Hand Side Plate Edge | | | Middle of Plate | | | Right Hand Side Plate Edge |

4. Relative Humidity of 35% at 55° C.

| Expected Dot Readings (%) | Actual Dot Readings (%) | | | | | | |
|---|---|---|---|---|---|---|---|
| 2 | 2 | 2 | 2 | 2 | 2 | 2 | 2 |
| 5 | 5 | 5 | 5 | 5 | 5 | 5 | 5 |
| 10 | 10 | 10 | 10 | 10 | 10 | 10 | 10 |
| 20 | 20 | 20 | 20 | 20 | 20 | 20 | 20 |
| 30 | 30 | 30 | 30 | 30 | 30 | 30 | 30 |
| 40 | 40 | 40 | 40 | 40 | 40 | 40 | 40 |
| 50 | 50 | 50 | 50 | 50 | 50 | 50 | 50 |
| 60 | 60 | 60 | 60 | 60 | 60 | 60 | 60 |
| 70 | 70 | 70 | 70 | 70 | 70 | 70 | 70 |
| 80 | 80 | 80 | 80 | 80 | 80 | 80 | 80 |
| 90 | 90 | 90 | 90 | 90 | 90 | 90 | 90 |
| 95 | 95 | 95 | 95 | 95 | 95 | 95 | 95 |
| | Left Hand Side Plate Edge | | | Middle of Plate | | | Right Hand Side Plate Edge |

Example 3

In a further test, a larger stack of test precursors was subjected to the heat treatment. The precursors were as described above for Example 1.

A stack was made up as follows: a wrapped section with ten dummy precursors at the top, then 110 precursors to be tested, then ten dummy precursors at the bottom. The wrapping and testing were all as previously described. The precursors were placed in the Sanyo Gallenkamp environmental chamber at 55° C, 40% relative humidity for 72 hours. In this experiment no edge effects on imaging and development were observed in the test precursors at the top or bottom of the stack.

| 1. Top of Stack | | | | | | | |
|---|---|---|---|---|---|---|---|
| Expected Dot Readings (%) | Actual Dot Readings (%) | | | | | | |
| 2  | 2  | 2  | 2  | 2  | 2  | 2  | 2  |
| 5  | 5  | 5  | 5  | 5  | 5  | 5  | 5  |
| 10 | 10 | 10 | 10 | 10 | 10 | 10 | 10 |
| 20 | 20 | 20 | 20 | 20 | 20 | 20 | 20 |
| 30 | 30 | 30 | 30 | 30 | 30 | 30 | 30 |
| 40 | 40 | 40 | 40 | 40 | 40 | 40 | 40 |
| 50 | 50 | 50 | 50 | 50 | 50 | 50 | 50 |
| 60 | 60 | 60 | 60 | 60 | 60 | 60 | 60 |
| 70 | 70 | 70 | 70 | 70 | 70 | 70 | 70 |
| 80 | 80 | 80 | 80 | 80 | 80 | 80 | 80 |
| 90 | 91 | 91 | 91 | 91 | 91 | 91 | 91 |
| 95 | 96 | 96 | 96 | 96 | 96 | 96 | 96 |
|  | Left Hand Side Plate Edge | | | Middle of Plate | | | Right Hand Side Plate Edge |

| 2. Bottom of Stack | | | | | | | |
|---|---|---|---|---|---|---|---|
| Expected Dot Readings (%) | Actual Dot Readings (%) | | | | | | |
| 2  | 2  | 2  | 2  | 2  | 2  | 2  | 2  |
| 5  | 5  | 5  | 5  | 5  | 5  | 5  | 5  |
| 10 | 10 | 10 | 10 | 10 | 10 | 10 | 10 |
| 20 | 20 | 20 | 20 | 20 | 20 | 20 | 20 |
| 30 | 30 | 30 | 30 | 30 | 30 | 30 | 30 |
| 40 | 40 | 40 | 40 | 40 | 40 | 40 | 40 |
| 50 | 50 | 50 | 50 | 50 | 50 | 50 | 50 |
| 60 | 60 | 60 | 60 | 60 | 60 | 60 | 60 |
| 70 | 70 | 70 | 70 | 70 | 70 | 70 | 70 |
| 80 | 80 | 80 | 80 | 80 | 80 | 80 | 80 |
| 90 | 91 | 91 | 91 | 91 | 91 | 91 | 91 |
| 95 | 96 | 96 | 96 | 96 | 96 | 96 | 96 |
|  | Left Hand Side Plate Edge | | | Middle of Plate | | | Right Hand Side Plate Edge |

Example 4

Precursors were prepared as described above for Example 1. For heat treatment they were laid horizontally in stacks on pallets, typically with about 1000 precursors in a stack, and with an interleaving sheet between adjacent precursors. The interleaving sheets were a polythene coated paper, no. 22, 6 gm$^{-2}$, available from Samuel Grant. At the top of the stack, 5 dummy precursors were placed. The substantially water impermeable barrier material employed to wrap around the stack was a SELLOTAPE metalised polyester tape 1695/91/92 as supplied by Samuel Grant. The barrier material had adhesive supplied on one side. It was manually stuck to the sides of the plate stack. Just one layer of material was used. At the top of the stack the free edges were stuck down to the face of the dummy precursor. In this way, the edges of the plate were completely covered in the barrier material.

Two stacks, one wrapped as described and one unwrapped were then placed in an oven for 72 hours at 55° C. The oven was a 2.3 m×2.3 m×2.3 m oven, recirculating warm air supplied by two fans via plenums on respective sides of the oven. The recirculating volume was 5500 cubic feet (186 m$^3$) per minute. At the end of this period, the stacks were removed from the oven and put in ambient air to cool entirely to ambient temperature, and the wrapping was then removed. Precursors from within each stack were tested across their entire surface. Imaging of the thermal precursors took place on a Creo TRENDSETTER, set up as described above and development took place in a Kodak Polychrome Graphics Mercury Mark V processor, set up as described above. Performance was assessed by comparing actual screen densities with expected densities, using the Gretag D 19C densitometer. The sensitometric performance of all samples in the test was nearly identical, and acceptable, in the centers of the precursors. However unacceptable performance at the edges was noted in the printing forms from the comparative unwrapped stack only, defined below in terms of "edge trim requirements," of a representative precursor from within each stack.

| Edge Trim Requirements (in mm), stacks heated together: | | | | |
|---|---|---|---|---|
|  | Edge 1 | Edge 2 | Edge 3 | Edge 4 |
| Unwrapped | 80 | 60 | 65 | 50 |
| Wrapped | 0 | 0 | 0 | 0 |

The invention is not restricted to the details of the foregoing embodiments. The invention extends to any feature, or any combination, of the features disclosed in this specification (including any accompanying claims, abstract and drawings), or to any step, or any combination of the steps of any method or process so disclosed.

We claim:

1. A method of treating a precursor, the precursor comprising a substrate and an imageable coating on the substrate, the imageable coating comprising a polymeric composition, the method comprising the step of heat-treating the precursor under conditions which inhibit the removal of moisture from the precursor, wherein heat-treatng includes holding the precursor at a temperature of about 40° C. or above for at least 12 hours.

2. The method of claim 1, wherein the imageable coating is positive-working.

3. The method of claim 1, wherein the polymeric composition includes a polymer having hydroxyl groups.

4. The method of claim 3, wherein the polymeric composition includes a novolak resin.

5. The method of claim 3, wherein the glass transition temperature of the polymeric composition is not exceeded during heat-treating of the precursor.

6. The method of claim 1, wherein the polymeric composition includes a polymer selected from a phenolic resin and a poly(hydroxystyrene) resin.

7. The method of claim 1, wherein the step of heat-treating includes holding the precursor at a temperature in the range 40–90° C., for at least 12 hours.

8. The method of claim 1, wherein the removal of moisture is inhibited by wrapping or encasing the precursor in a substantially water-impermeable material.

9. The method of claim 8, wherein the material is a polythene film.

10. The method of claim 8, wherein the material is a metallized polyester tape.

11. The method of claim 1, wherein the step of heat-treating is carried out in an environment having a relative humidity of at least about 25%.

12. The method of claim 1, wherein the coating is such that its solubility in a developer is not increased by incident UV radiation.

13. The method of claim 1, wherein the imageable coating is such that it may be patternwise imaged by direct heat; or by indirect heat from charged particle radiation or electromagnetic radiation converted to heat by the coating.

14. The method of claim 1, wherein the imageable coating comprises a radiation-absorbing compound able to absorb electromagnetic radiation entirely or predominantly in the range 600 to 1400 nm and convert it to heat.

15. The method of claim 1 wherein the imageable coating comprises insolubilizer means which acts to inhibit the dissolution of the coating in a developer prior to imaging.

16. The method of claim 1, wherein the step of heat-treating includes holding the precursor at a temperature of about 55° C., for at least 12 hours.

17. The method of claim 1, wherein the step of heat-treating is carried out in an environment having a relative humidity of about 35%.

18. The method of claim 1, wherein the precursor is in a stack of precursors to be treated, and the step of heat-treating is applied to the stack.

19. A method of treating a precursor in a precursor coil, the precursor comprising a substrate and an imageable coating on the substrate, the imageable coating comprising a polymeric compostion, the method comprising the step of heat-treating the precursor coil under conditions which inhibit the removal of moisture from the precursor.

20. A method of treating a precursor in a stack of precursors, the precursor comprising a substrate and an imageable coating on the substrate, the imageable coating comprising a polymeric composition, the method comprising the step of heat-treating the stack of precursors under conditions which inhibit the removal of moisture from the precursor, wherein the stack comprises at least ten such precursors.

21. The method of claim 20, wherein the imageable coating is positive-working.

22. The method of claim 20, wherein the polymeric composition includes a polymer having hydroxyl groups.

23. The method of claim 22, wherein the polymeric composition includes a novolak resin.

24. The method of claim 22, wherein the glass transition temperature of the polymeric composition is not exceeded in the heat treatment.

25. The method of claim 20, wherein the polymeric composition includes a polymer selected from a phenolic resin and a poly(hydroxystyrene) resin.

26. The method of claim 20, wherein the step of heat-treating includes holding the stack of precursors at a temperature of about 40° C. or above, for at least 12 hours.

27. The method of claim 20, wherein the step of heat-treating includes holding the stack of precursors at a temperature in the range 40–90° C.

28. The method of claim 20, wherein the removal of moisture is inhibited by wrapping or encasing the precursor in a substantially water-impermeable material.

29. The method of claim 28, wherein the material is a polythene film.

30. The method of claim 28, wherein the material is a metallized polyester tape.

31. The method of claim 20, wherein the step of heat-treating is carried out in an environment having a relative humidity of at least about 25%.

32. The method of claim 20, wherein the coating is such that its solubility in a developer is not increased by incident UV radiation.

33. The method of claim 20, wherein the imageable coating is such that it may be patternwise imaged by direct heat; or by indirect heat from charged particle radiation or electromagnetic radiation converted to heat by the coating.

34. The method of claim 20, wherein the imageable coating comprises a radiation-absorbing compound able to absorb electromagnetic radiation entirely or predominantly in the range 600 to 1400 nm convert it to heat.

35. The method of claim 20 wherein the imageable coating comprises insolubilizer means which acts to inhibit the dissolution of the coating in a developer prior to imaging.

36. The method of claim 20, wherein the precursor is a printing form precursor.

37. The method of claim 20, wherein the precursor is an electronic part precursor.

38. The method of claim 20, wherein the step of heat-treating includes holding the stack of precursors at a temperature of about 55° C., for at least 12 hours.

39. The method of claim 20, wherein the step of heat-treating is carried out in an environment having a relative humidity of about 35%.

40. A method of treating an electronic part precursor, the precursor comprising a substrate and an imageable coating on the substrate, the imageable coating comprising a polymeric composition, the method comprising the step of heat-treating the precursor under conditions which inhibit the removal of moisture from the precursor, where heat-treating includes holding the precursor at a temperature of about 40° C. or above for at least 12 hours; to provide the electronic part precursor.

41. A method for producing an imaged article, comprising:

(a) providing a precursor having an imageable coating on a substrate, the imageable coat including a polymeric composition;

(b) heat-treating the precursor at a temperature of about 40° C. or above for at least 12 hours, such that the removal of moisture from the precursor during heat-treating is inhibited;

(c) imagewise exposing the coating; and (d) contacting the exposed coating with an aqueous developer, to produce the imaged article.

42. The method of claim 41, wherein the imaged article is a printing form.

43. A method of producing an imaged article, comprising:

(a) providing a precursor having an imageable coating on a substrate, the imageable coating comprising a polymeric composition;

(b) heat-treating the precursor among a stack of at least ten such precursors, such that the removal of moisture from the precursor is inhibited;

(b) imagewise exposing the imageable coating; and (c) contacting the exposed imageable coating with an aqueous developer, to produce the imaged article.

44. The method of claim 43, wherein the imaged article is a printing form.

* * * * *

UNITED STATES PATENT AND TRADEMARK OFFICE
CERTIFICATE OF CORRECTION

PATENT NO. : 6,706,466 B1 Page 1 of 1
APPLICATION NO. : 09/587813
DATED : March 16, 2004
INVENTOR(S) : Martyn Lott et al.

It is certified that error appears in the above-identified patent and that said Letters Patent is hereby corrected as shown below:

<u>Column 18, Claim 1</u>
Line 51, delete the word "treatng" and replace it with -- treating --

<u>Column 20, Claim 41</u>
Line 42, delete the word "coat" and replace it with -- coating --

Signed and Sealed this

Eighth Day of January, 2008

JON W. DUDAS
*Director of the United States Patent and Trademark Office*